United States Patent [19]

Rathke

[11] Patent Number: 5,045,793
[45] Date of Patent: Sep. 3, 1991

[54] TOROIDS AS NMR DETECTORS IN METAL PRESSURE PROBES AND IN FLOW SYSTEMS

[75] Inventor: Jerome W. Rathke, Bolingbrook, Ill.

[73] Assignee: The United States of America as represented by the United States Department of Energy, Washington, D.C.

[21] Appl. No.: 472,924

[22] Filed: Jan. 31, 1990

[51] Int. Cl.⁵ ............................................ G01R 33/20
[52] U.S. Cl. .................................... 324/318; 324/321
[58] Field of Search .............. 324/300, 307, 309, 310, 324/311, 312, 313, 314, 316, 318, 322; 128/653 A

[56] References Cited

U.S. PATENT DOCUMENTS 4,456,882 6/1984 Doty .................................. 324/321

OTHER PUBLICATIONS

D. W. Alderman and D. M. Grant, A Cavity Technique for Use in High Field Superconducting NMR Probes, 21st Experimental NMR Conference, Tallahasse, FL (1980). The authors discuss factors related to the signal to noise ratio produced by several different NMR probe resonators.

S. B. W. Roeder, A. A. V. Gibson, and E. Fukushima, Fundamental and Practical Signal to Noise Ratio Considerations, 23rd NMR Conference, Madison, WI (1982). The authors discuss the signal to noise ratio associated with a coil.

T. E. Glass and H. C. Dorn, A High Sensitivity Toroid Detector for 17 O NMR, J. of Magnetic resonance 52, 518-522 (1983). The authors compare several toroidal configurations with standard nontoroidal configurations and discuss the respective advantages and problems associated with the various designs.

T. E. Glass and H. C. Dorn, B1 and B0 Homogeneity Considerations for a Toroid-Shaped Sample and Detector, J. of Magnetic Resonance 51, 527-530 (1983). The advantages and problems associated with the use of a toroid in NMR studies is discussed.

Primary Examiner—Michael J. Tokar
Attorney, Agent, or Firm—Bradley W. Smith; John M. Albrecht; William R. Moser

[57] ABSTRACT

A nuclear magnetic resonance probe to measure the properties of a sample under high pressure conditions. The apparatus employs a free standing, elongated toroidal coil as the RF transmitter and receiver.

4 Claims, 2 Drawing Sheets

CROSS SECTION

END VIEW OF PLUG

TOROIDS AS NMR DETECTORS IN METAL PRESSURE PROBES AND IN FLOW SYSTEMS

CONTRACTUAL ORIGIN OF THE INVENTION

The United States Government has rights in this invention pursuant to Contract No. W-31-109-ENG-38 between the U.S. Department of Energy and Chicago.

BACKGROUND OF THE INVENTION

This invention relates to a probe used to carry out nuclear magnetic resonance (NMR) measurements on a sample under pressure. Pressure vessels are used to contain the sample when a high pressure environment is needed to conduct the experiment or produce the desired compound to be subjected to NMR. If high pressure is not a requirement, an ambient pressure probe is used. To the best of the applicant's knowledge, all commercially produced probes have fallen into this latter category while the high pressure probes have been specifically designed and constructed according to an experimenter's specifications on an individual basis.

NMR is a useful tool for determining molecular structure through the examination of the response of nuclear magnetic moments to an externally applied homogeneous magnetic field (B0). The probe used in high pressure NMR houses the sample and is placed in the B0 field in a specified orientation with respect to the magnetic field lines. The presence of B0 causes the magnetic moments of the targeted class of nuclei in the sample to process about the field's axis at a rate which is dependent on the magnetic field strength. A transmitter coil internal to the vessel and oriented to apply a magnetic field (B1) perpendicular to B0 is then energized at a specified RF frequency termed the Larmor frequency. The newly created magnetic field, B1, interacts with the nuclear magnetic moments processing about the B0 axis. This interaction of the B1 field with the nuclear magnetic moments shifts the precession of the magnetic moments to the B1 axis during the period the RF field is energized. The RF field is then deenergized and the sample response to the previously applied RF field is received using the same coil as was used for the RF transmission. Due to the dual function of the coil, the transmission and reception phases alternate over a specific period. The received signal from the energized nuclei serves as the input signal for spectroscopic analysis of the sample.

The sensitivity of the coil during its receive phase is dependent on the coil efficiency which, absent the effect of the materials used in construction, is highly dependent on the shape of the coil and its distance from an electrically conducting body. Three coil configurations are generally considered for use as the RF coil: the Helmholtz, the solenoidal, and the toroidal. Of the three, the toroid is the most efficient for a metal pressure vessel. This is due to the greatly reduced coil-vessel magnetic coupling associated with the toroid which results from the confinement of the magnetic field, produced by the RF transmission, to the volume enclosed by the toroid. The other coil configurations, the Helmholtz and the solenoidal, do not produce a confined field; rather, they produce a field both interior and exterior to the confines of the coil. As a result, these coils incur a significant magnetic coupling effect with the metal container walls unless placed sufficiently far from the conducting body. The presence of a coil-vessel magnetic coupling results in an energy loss to the conductor in the form of eddy currents during transmission phase of the RF signal. During the receive phase, this coupling causes the coil to pick up thermal and other noises from the conducting walls of the vessel housing the sample and coil. This results in a smaller absolute signal to noise ratio (S/N) for the Helmholtz and solenoidal coils when compared to the absolute signal to noise ratio of the toroid; as a result the effectiveness of the prior coils in receiving the signal from the sample is compromised when compared to that of the toroid. Since, as indicated by Glass and Dorn, "B1 and B0 Homogeneity Considerations for a Toroid-Shaped Sample and Detector", *Journal of Maonetic Resonance*, vol. 51, 1983, pp. 527–530, the majority of coils used in the detection of NMR signals for superconducting magnetic systems are of the Helmholtz type, the poor signal to noise ratio is a problem in accurate data acquisition. To help alleviate the magnetic coupling problem associated with coil generated fields and the surrounding conducting bodies, it was recommended by Hoult that coils which develop this coupling should be positioned a distance equal to the coil's largest dimension from the nearby conductors. This greatly increased the required size of the pressure vessel or other conducting container, and resulted in magnetic field requirements which were more difficult to achieve due to increased size requirements. For a pressure vessel this essentially increases the inside diameter of the vessel by a factor of three with a resulting increase in the required wall thickness. Since the use of a toroid essentially eliminates magnetic coupling with the wall, these spacing requirements are essentially eliminated.

Glass and Dorn, "A High Sensitivity Toroid Detector for O NMR", *Journal of Maonetic Resonance*. vol. 52, 1983, pp. 518–522, experimented with a toroid formed on a Pyrex glass cell as a possible alternative to the standard Helmholtz coil in an effort to produce an improved S/N ratio. However, to obtain this improved S/N, they determined that the ratio of the inner to outer radius (R2/R1) should be less than 1.4 so as not to compromise the B1 field homogeneity. However, this radius limitation requirement results in a smaller volume within which to house the sample. Thus, in an effort to retain the volume needed to contain the sample while at the same time keeping the R2/R1 low, Glass and Dorn suggested elongating the toroid in a direction perpendicular to the plane of the toroid. With this reconfiguration of their glass cell, they obtained a slight improvement in the S/N when compared to a circular cross section toroid with the same R2/R1. However, they also determined that their toroid degraded the spatial homogeneity of the B0 field above the toroid causing a resulting degradation in the achievable resolution. As a result, a reduction in the B0 spatial homogeneity places a limit on the type nuclei the probe can be used to analyze. To counter this, they had to design specific shim coils for placement above and below the torus region. This action resulted in an improvement in the B0 homogeneity; however, the requirement for specialized shim coils leads to much greater operational complexity particularly when a pressure vessel is required to contain the sample. They attempted to use a standard commercially produced shim which is employed external to the probe in the spectrometer, but they were not able to duplicate the results of their specifically designed shim.

Although the toroid would appear to offer many advantages over other coil configurations, it also produced several problems in the areas of B0 field homogeneity, R2/R1 relationships to B1 homogeneity, the necessity for specifically designed shims and sample resolution. Therefore, one of the objects of the present invention is to improve on the capability of the toroid to funciton as an RF coil in a NMR probe.

Another object of the present invention is to provide a high pressure vessel capable of housing the pressurized sample and the toroid coil in a manner compatible with NMR spectroscopy.

Additional objects, advantages and novel features of the invention will become apparent to those skilled in the art upon examination of the following and by practice of the invention.

SUMMARY OF THE INVENTION

To achieve the forgoing and other objects, this invention comprises a novel nuclear magnetic resonance apparatus to conduct measurements on a sample using a pressure vessel to contain the sample at an elevated pressure and a toroidal coil to radiate an RF signal and receive a sample response. Applicant seeks to accomplish through novel improvements in the capability of a toroid to operate as a transmitter/receiver in a high pressure NMR environment. To the best of applicant's knowledge, a toroid has never been used as an RF coil in a high pressure NMR probe prior to applicant's invention.

The applicant employs a toroid which differs in structure from the toroidal coils previously used. In the past, the wire comprising the coil loops was wound on a glass form or cell. Since the applicant feels that the material base on which the coil is wound can serve as a detriment to the homogeneity of the B0 field, he employs a coil which uses the stiffness of the wire to maintain the coil's basic shape and which is free standing except for the electrical lead wires which connect it to an external spectrograph. Developmental testing of the coil shows an improved B0 homogeneity over glass wound toroids. As a result, the applicant's toroidal design eliminates the need for a specially designed shim system; as a result, a standard commercial shim system is used and was found to function as well as the previously referred to specially designed system in retaining the B0 homogeneity over a toroid. This functions to provide a better line width resolution than that experienced by the toroids wound over glass forms and linked to a commercial shim.

A Teflon liner supports the coil and acts as a buffer between the coil and the wall of the vessel. The liner fits snugly over the coil and closely fits the inside walls of the vessel. The actual contact between the liner and the outside radius of the coil insures the dimensional stability of the coil in the radial direction and establishes the coil's distance from the walls of the vessel. Although the liner provides mechanical stability, it is possible to proceed without the liner if the stability of the coil itself were increased.

Another factor which needs to be considered is the homogeneity of the B1 field. This is largely dependent on R2/R1. As discussed previously, if the ratio is greater than 1.4, the B1 homogeneity will be compromised. One method of keeping this ratio low while at the same time retaining a large enough volume for the sample is to elongate the toroid along the B0 axis while narrowing it along the B1 axis. The applicant's toroid employs this scheme for a freestanding coil without an internal material form.

A standard tapped-parallel tuned circuit is employed as a tuning device for the RF coil. This functions to tune the NMR apparatus to the required Larmor frequency. The output of the coil serves as an input for a commercial spectrograph which employs the aforementioned commercial shim in the formulation of the spectral response.

Applicant's use of a toroidal coil interior to a pressure vessel represents a novel design and produces an improved signal to noise ratio when compared to the standard Helmhotz coil. This is due to the greatly reduced magnetic coupling of a toroid when placed in the vicinity of an electrical conductor. The use of a formless, free-standing toroidal coil as opposed to a toroidal coil wound on a glass cylinder results in an improved linewidth resolution due to less distortion of the B0 homogeneity; thus, allowing for a greater flexibility in the sample selection for NMR spectroscopy. This also allows the use of a standard commercial shim in place of a specifically designed shim and thus eliminates the need for additional electrical hardware exterior to the pressure vessel.

BRIEF DESCRIPTION OF THE DRAWINGS

The present invention is illustrated in the accompanying drawings where.

DETAILED DESCRIPTION OF THE INVENTION

Figure 1:
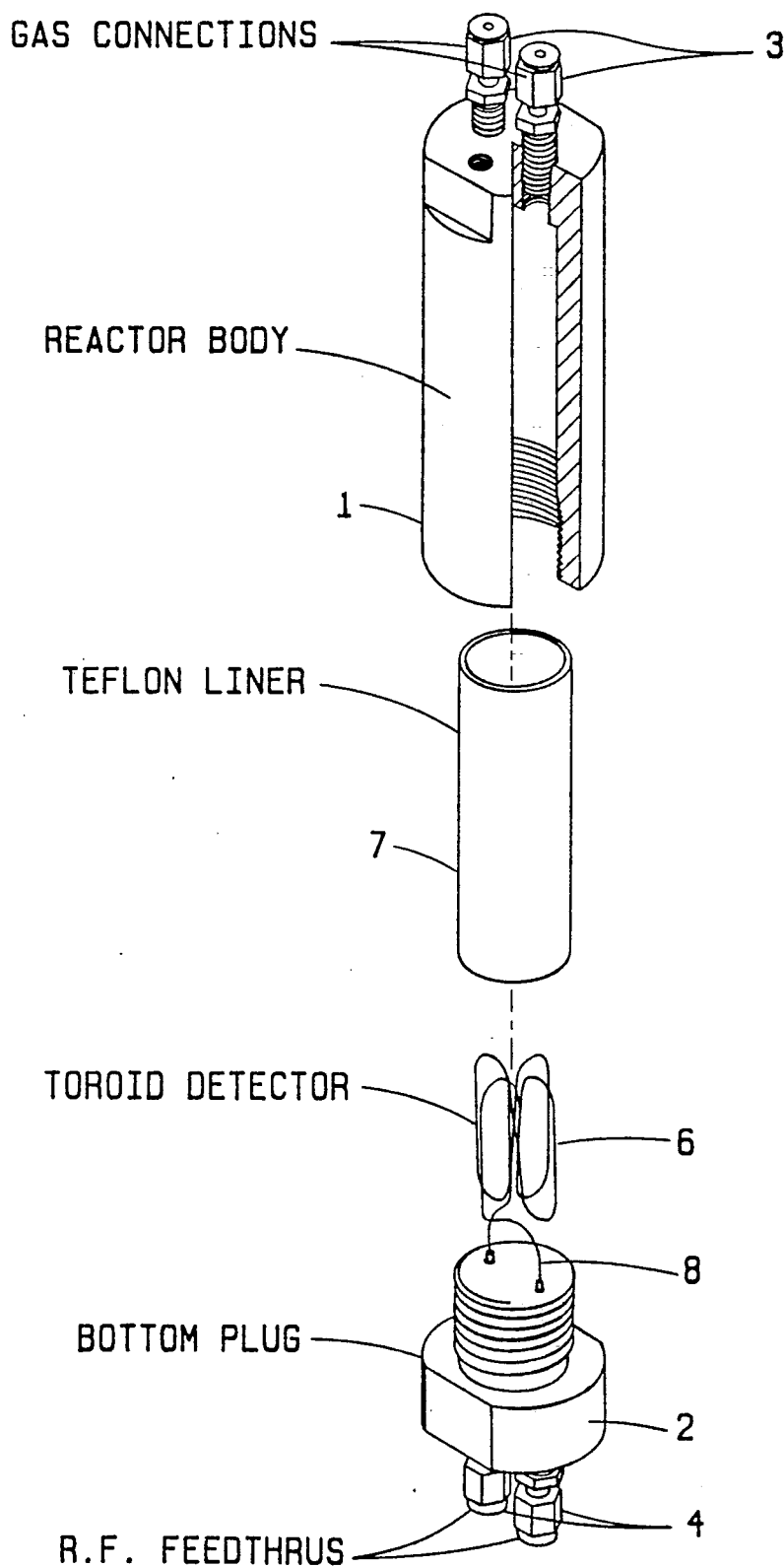
FIG. 1 shows an exploded view of the apparatus
Figures 2, 3:
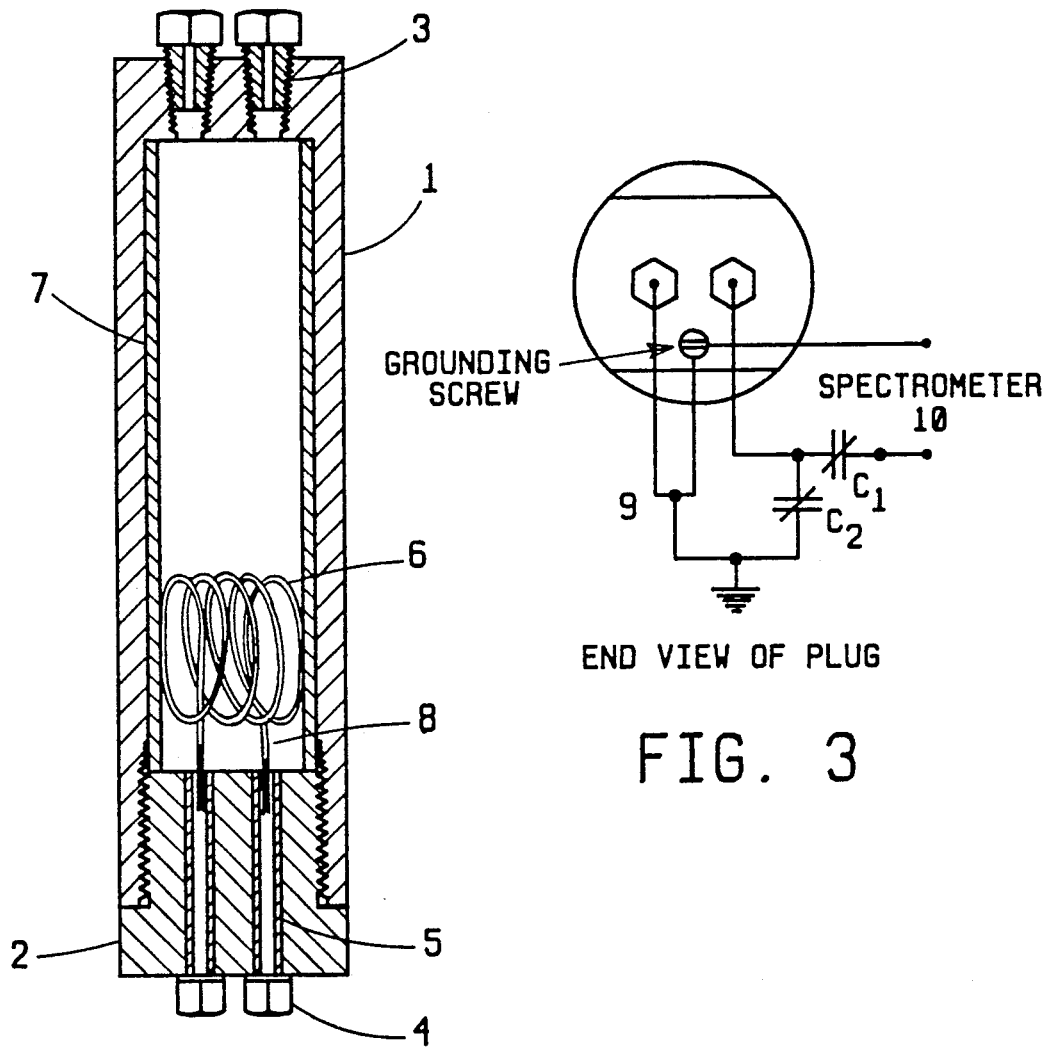
FIG. 2 is across section of the apparatus
FIG. 3 is a view of the electrical connectors

Referring to the drawings, FIG. 1 shows an exploded view of an novel high pressure nuclear magnetic resonance probe while FIG. 2 shows a cross section of the apparatus. A tapped Berylco alloy 25 cylindrical reactor body 1 receives a similarly threaded Berylco alloy 25 bottom plug 2. The gas (fluid) connections 3 which link the pressure chamber of the vessel to the externally supplied sample source are standard 1/16 inch compression fittings (Parker or single ferrule Swagelok). Standard 1/16 inch compression fittings 4 (Vespel - SP1), in the base plug, form the RF feedthroughs 4 which serve as the entry points for the coil leads. To provide for insulation and sealing of the coil leads, Teflon tubing 5 (1/16" O.D.×20 gauge I.D.) lines the feedthroughs 4. The resulting capacitance of the feedthrough is 6 pf. The pressure vessel, the gas connectors 3 and the feedthroughs 4 were pressure tested to 8500 psi hydrostatic pressure and held at a pressure of 4750 psi for 12 hours using Nitrogen gas as the pressurizing fluid.

The toroid coil 6 is constructed of 20 gauge Tefloncoated (0.004", dielectric rating: 3200 V) copper magnet wire (1 mm O.D.). The coil 6 fits snugly into a cylindrical Teflon liner 7 which closely fits the inside wall of the reactor body 1. The Teflon liner 7 insures dimensional stability of the coil 6 and establishes the coil's 6 distance from the walls of the reactor body 1. Except for the presence of the Teflon liner 7, the coil 6 is free-standing, supported only by the leads 8 from coil 6 to the RF feedthrough 4. To improve the volume of the sample encompassed by the toroid while keeping the R2/R1 ratio low the toroid 6 is elongated along a direction parallel to the long axis of the reactor body The coil 6 was fabricated by wrapping the wire along a rounded rectangular body and then removing the wire from the form to leave only a string of connected coils. The coils are formed into the shape of a toroid with two lead wires 8 which serve as supports for the coil as they feed through the bottom plug 2 and as electrical connectors to external apparatus.

Referring to FIG. 3, a standard tapped-parallel tuned-circuit 9 connects to the exit taps of the RF feedthrough 4. This circuit 9 serves to tune the probe to the required RF frequency. Both C1 and C2 are 1.0–38 pf glass tuning capacitors.

As depicted in the preferred embodiment, the NMR probe allows the analysis of either a pressurized fluid or gas sample using the gas connections 3 to input and bleed off the sample. The tuning circuit 9 focuses the RF energy emitted by the coil 6 to a specific Larmor The same coil then operates as a receiver to pickup the nucleus' magnetic moments response to the previously applied RF field. A General Electric GN300/89 spectrometer with an Oxford 89 mm magnet and standard shim system 10 records the spectral data.

The embodiments of this invention in which an exclusive property or privilege is claimed are defined as follows:

1. An apparatus to carry out nuclear magnetic resonance (NMR) measurements on a sample under a pressure, said apparatus comprising:
  a pressure vessel configured to permit the transfer of a pressurized fluid into and out of said vessel through fluid connectors, and a toroidal coil positioned within said pressure vessel, and means to transfer an electrical signal to and from said coil by means of electrical devices transcending said pressure vessel by means of feedthroughs and terminating at electrical connectors.

2. The apparatus of claim 1 where said coil is free-standing supported only by electrical leads connected to said electrical connecting devices.

3. The apparatus of claim 2 including a liner which separates said coil from the inside wall of said pressure vessel and acts to maintain said coil's shape and distance from the walls.

4. The apparatus of claim 1 where a tuning circuit is connected to said electrical connectors.

* * * * *